US009252728B2

(12) United States Patent
Vaillancourt et al.

(10) Patent No.: US 9,252,728 B2
(45) Date of Patent: Feb. 2, 2016

(54) NON-SPEECH CONTENT FOR LOW RATE CELP DECODER

(71) Applicant: VOICEAGE CORPORATION, Town of Mount Royal (CA)

(72) Inventors: Tommy Vaillancourt, Sherbrooke (CA); Milan Jelinek, Sherbrooke (CA)

(73) Assignee: VoiceAge Corporation, Town of Mount Royal, Quebec (CA)

(*) Notice: Subject to any disclaimer, the term of this patent is extended or adjusted under 35 U.S.C. 154(b) by 391 days.

(21) Appl. No.: 13/667,921

(22) Filed: Nov. 2, 2012

(65) Prior Publication Data

US 2013/0121508 A1  May 16, 2013

Related U.S. Application Data

(60) Provisional application No. 61/555,246, filed on Nov. 3, 2011.

(51) Int. Cl.
G10L 21/00     (2013.01)
H03G 3/20      (2006.01)
G10L 19/20     (2013.01)
G10L 19/26     (2013.01)
G10L 19/08     (2013.01)
(Continued)

(52) U.S. Cl.
CPC  *H03G 3/20* (2013.01); *G10L 19/20* (2013.01); *G10L 19/26* (2013.01); *G10L 19/08* (2013.01); *G10L 19/22* (2013.01); *G10L 25/78* (2013.01); *G10L 25/81* (2013.01); *G10L 25/93* (2013.01)

(58) Field of Classification Search
CPC ........... H03G 5/00; G10L 19/12; G10L 19/02
USPC ....... 381/22, 98; 704/206, 500, E19.001, 219
See application file for complete search history.

(56) References Cited

U.S. PATENT DOCUMENTS 6,240,386 B1   5/2001  Thyssen et al.
6,704,711 B2   3/2004  Gustafsson et al.
(Continued)

FOREIGN PATENT DOCUMENTS

WO      03102921     12/2003
WO     2007073604     7/2007
(Continued)

OTHER PUBLICATIONS

Johnston, et al., "Transform Coding of Audio Signals Using Perceptual Noise Criteria", IEEE Journal on Selected Areas in Communications, vol. 6, No. 2, pp. 314-323, Feb. 1988.
(Continued)

*Primary Examiner* — Disler Paul
(74) *Attorney, Agent, or Firm* — K&L Gates LLP

(57) ABSTRACT

A method and device for modifying a synthesis of a time-domain excitation decoded by a time-domain decoder, wherein the synthesis of the decoded time-domain excitation is classified into one of a number of categories. The decoded time-domain excitation is converted into a frequency-domain excitation, and the frequency-domain excitation is modified as a function of the category in which the synthesis of the decoded time-domain excitation is classified. The modified frequency-domain excitation is converted into a modified time-domain excitation, and a synthesis filter is supplied with the modified time-domain excitation to produce a modified synthesis of the decoded time-domain excitation.

32 Claims, 4 Drawing Sheets

(51) Int. Cl.
*G10L 25/81* (2013.01)
*G10L 25/78* (2013.01)
*G10L 25/93* (2013.01)
*G10L 19/22* (2013.01)

(56) References Cited

U.S. PATENT DOCUMENTS

| | | | |
|---|---|---|---|
| 7,139,700 | B1 | 11/2006 | Stachurski et al. |
| 7,205,910 | B2 * | 4/2007 | Honma et al. ............... 341/50 |
| 7,272,553 | B1 * | 9/2007 | Chrissan et al. ............ 704/219 |
| 7,991,621 | B2 * | 8/2011 | Oh et al. .................... 704/500 |
| 8,135,585 | B2 * | 3/2012 | Lee et al. .................... 704/219 |
| 8,195,469 | B1 * | 6/2012 | Serizawa et al. ............ 704/500 |
| 8,249,866 | B2 | 8/2012 | Miscki |
| 8,958,572 | B1 * | 2/2015 | Solbach ..................... 381/94.7 |
| 2004/0039568 | A1 * | 2/2004 | Toyama et al. .............. 704/229 |
| 2007/0094016 | A1 | 4/2007 | Jasiuk et al. |
| 2007/0219785 | A1 | 9/2007 | Gao |
| 2010/0114567 | A1 | 5/2010 | Bruhn |
| 2011/0173005 | A1 * | 7/2011 | Hilpert et al. ............... 704/500 |
| 2011/0320196 | A1 * | 12/2011 | Choo et al. .................. 704/229 |

FOREIGN PATENT DOCUMENTS

| | | |
|---|---|---|
| WO | 2010/006717 A1 | 1/2010 |
| WO | 2010/040522 A2 | 4/2010 |

OTHER PUBLICATIONS

3GPP TS 26.190 V6.1.1 (Jul. 2005), 3rd Generation Partnership Project; Technical Specification Group Services and System Aspects; Speech codec speech processing functions; Adaptive Multi-Rate—Wideband (AMR-WB) speech codec; Transcoding functions (Release 6).

PCT International Search Report for International Application No. PCT/CA2012/001011, Date of Mailing Feb. 1, 2013, (8 pages).

* cited by examiner

NON-SPEECH CONTENT FOR LOW RATE CELP DECODER

CROSS-REFERENCE TO RELATED APPLICATIONS

This application claims priority to and the benefit of U.S. provisional patent application No. 61/555,246, filed on Nov. 3, 2011, the entire contents of which are hereby incorporated by reference herein.

FIELD

The present disclosure relates to a device and method for modifying a synthesis of a time-domain excitation decoded by a time-domain decoder.

BACKGROUND

A state-of-the-art conversational codec can represent with a very good quality a clean speech signal with a bit rate of around 8 kbps and approach transparency at a bit rate of 16 kbps. To sustain this high speech quality even at low bit rate a multi modal coding scheme may be used. Usually the input sound signal is split among different categories reflecting its characteristics. For example, the different categories may include voiced, unvoiced and onset. The codec uses different coding modes optimized for all these categories.

However, some deployed speech codecs do not use this multi modal approach resulting in a suboptimal quality especially at low bit rates for a sound signal different from clean speech. When a codec is deployed, it is hard to modify the encoder due to the fact that the bitstream is standardized and any modification to the bitstream would break the interoperability of the codec. However modifications to the decoder can be implemented to improve the quality perceived on the receiver side.

DESCRIPTION

Figure 1:
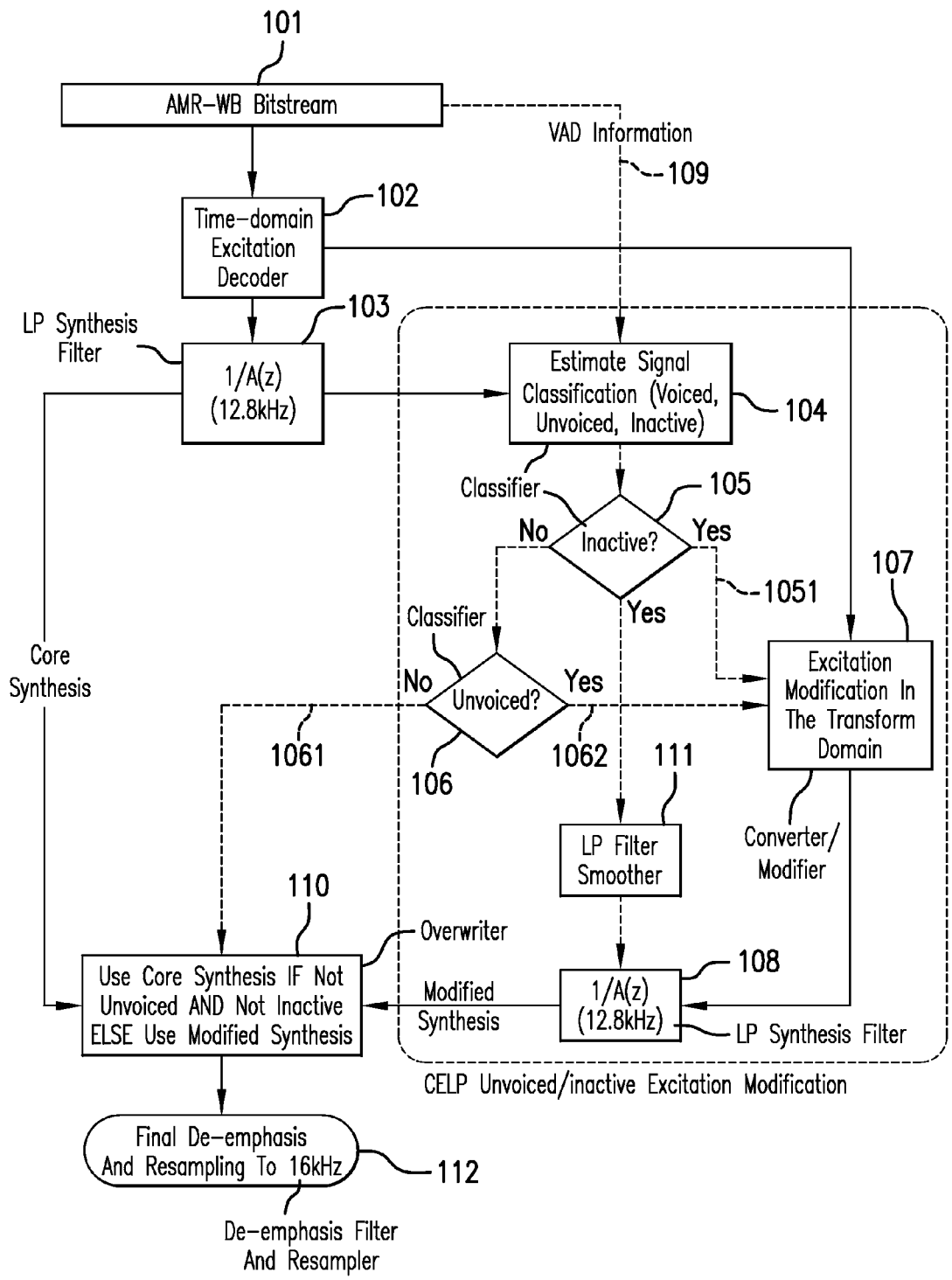
FIG. 1 is a simplified schematic diagram showing modification of a CELP decoder for inactive and active unvoiced frames improvement.

According to a first aspect, the present disclosure is concerned with a device for modifying a synthesis of a time-domain excitation decoded by a time-domain decoder, comprising: a classifier of the synthesis of the decoded time-domain excitation into one of a number of categories; a converter of the decoded time-domain excitation into a frequency-domain excitation; a modifier of the frequency-domain excitation as a function of the category in which the synthesis of the decoded time-domain excitation is classified by the classifier; a converter of the modified frequency-domain excitation into a modified time-domain excitation; and a synthesis filter supplied with the modified time-domain excitation to produce a modified synthesis of the decoded time-domain excitation.

According to another aspect, the present disclosure provides a device for decoding a sound signal encoded by encoding parameters, comprising: a decoder of a time-domain excitation in response to the sound signal encoding parameters; a synthesis filter responsive to the decoded time-domain excitation to produce a synthesis of said time-domain excitation; and the above described device for modifying the synthesis of the time-domain excitation.

According to a third aspect, the present disclosure is concerned with a method for modifying a synthesis of a time-domain excitation decoded by a time-domain decoder, comprising: classifying the synthesis of the decoded time-domain excitation into one of a number of categories; converting the decoded time-domain excitation into a frequency-domain excitation; modifying the frequency-domain excitation as a function of the category in which the synthesis of the decoded time-domain excitation is classified; converting the modified frequency-domain excitation into a modified time-domain excitation; and synthesizing the modified time-domain excitation to produce a modified synthesis of the decoded time-domain excitation.

According to a further aspect, the present disclosure provides a method for decoding a sound signal encoded by encoding parameters, comprising: decoding a time-domain excitation in response to the sound signal encoding parameters; synthesizing the decoded time-domain excitation to produce a synthesis of said time-domain excitation; and the above described method for modifying the synthesis of the time-domain excitation.

The foregoing and other features of the device and method for modifying the synthesis of a time-domain excitation will become more apparent upon reading of the following non restrictive description, given by way of non limitative example with reference to the accompanying drawings.

The present disclosure proposes an approach to implement on the decoder side a multimodal decoding such that interoperability is maintained and the perceived quality is increased. In the disclosure, although AMR-WB as described in reference [3GPP TS 26.190, "Adaptive Multi-Rate-Wideband (AMR-WB) speech codec; Transcoding functions] of which the full content is incorporated herein by reference, is used as illustrative example, it should be kept in mind that this approach can be applied to other types of low bit rate speech decoders as well.

Referring to FIG. 1, to achieve this multimodal decoding, a time-domain excitation decoder 102 first decodes entirely the received bitstream 101, for example the AMR-WB bitstream, to get a complete time-domain Code-Excited Linear Prediction (CELP) decoded excitation. The decoded time-domain excitation is processed through a Linear Prediction (LP) synthesis filter 103 to obtain a speech/sound signal time-domain synthesis at the inner sampling frequency of the decoder. For AMR-WB, this inner sampling frequency is 12.8 kHz, but for another codec it could be different.

The time-domain synthesis of the current frame from the LP synthesis filter 103 is processed through a classifier 104-105-106-301 (FIGS. 1, 2 and 3) supplied with voice activity detection (VAD) information 109 from the bitstream 101. The classifier 104-105-106-301 analyses and categorizes the time-domain synthesis either as inactive speech, active voiced speech, active unvoiced speech, or generic audio. Inactive speech (detected at 1051) includes all background noises between speech burst, active voiced speech (detected at 1061) represents a frame during an active speech burst having voiced characteristics, active unvoiced speech (detected at 1062) represents a frame during a speech burst having unvoiced characteristics, and generic audio (detected at 3010) represents music or reverberant speech. Other categories can be added or derived from the above categories. The disclosed approach aims at improving in particular, but not exclusively, the perceived quality of the inactive speech, the active unvoiced speech and the generic audio.

Once the category of the time-domain synthesis is determined, a converter/modifier 107 converts the decoded excitation from the time-domain excitation decoder 102 into frequency domain using a non-overlap frequency transform. An overlap transform can be used as well, but it implies an increase of the end-to-end delay which is not desirable in most cases. The frequency representation of the excitation is then split into different frequency bands in the converter/modifier 107. The frequency bands can have fixed size, can rely on critical bands [J. D. Johnston, "Transform coding of audio signal using perceptual noise criteria," IEEE J. Select. Areas Commun., vol. 6, pp. 314-323, February 1988], of which the full content is incorporated herein by reference, or any other combinations. Then the energy per band is computed and kept in memory in the converter/modifier 107 for use after the reshaping process to ensure the modification does not alter the global frame energy level.

The modification of the excitation in the frequency domain as performed by the converter/modifier 107 may differ with the classification of the synthesis. For inactive speech and active unvoiced speech, the reshaping may consist of a normalization of the low frequencies with an addition of noise and replacement of the high frequency content with noise only. A cut-off frequency of the decoded time-domain synthesis, the limit between low and high frequency, can be fixed at a value around 1 to 1.2 kHz. Some of the low frequency content of the decoded time-domain synthesis is kept to prevent artifact when switching between a non-modified frame and a modified frame. It is also possible to make the cut-off frequency variable from frame to frame by choosing a frequency bin as a function of the decoded pitch from the time-domain excitation decoder 102. The modification process has as effect of removing the kind of electrical noise associated with the low bit rate speech codec. After the modification process, a gain matching per frequency band is applied to get back the initial energy level per frequency band with a slight increase of the energy for the frequencies above 6 kHz to compensate for an LP filter gain drop at those frequencies.

For a frame categorized as generic audio, the processing in the converter/modifier 107 is different. First the normalization is performed per frequency band for all the bands. In the normalization operation, all the bins inside a frequency band that are below a fraction of the maximum frequency value within the band are set to zero. For higher frequency bands, more bins are zeroed per band. This simulates a frequency quantification scheme with a high bit budget, but having more bits allocated to the lower frequencies. After the normalization process, a noise fill can be applied to replace the zeroed bins with random noise but, depending on the bit rate, the noise fill is not always used. After the modification process, a gain matching per frequency band is applied to get back the initial energy level per frequency band and a tilt correction depending on the bit rate is applied along the frequency band to compensate for the systematic under estimation of the LP filter in case of generic audio input. Another differentiation for the generic audio path comes from the fact that the gain matching is not applied over all frequency bins. Because the spectrum of generic audio is usually more peaky than speech, the perceived quality is improved when it is possible to identify spectral pulses and to put some emphasis thereon. To do so, full gain matching with tilt correction is applied only to the highest energy bins inside a frequency band. For the lowest energy bins, only a fraction of the gain matching is applied to those bins. This results in increasing the spectral dynamic.

After the excitation frequency reshaping and gain matching, the converter/modifier 107 applies an inverse frequency transform to obtain the modified time-domain excitation. This modified excitation is processed through the LP synthesis filter 108 to obtain a modified time-domain synthesis. An overwriter 110 simply overwrites the time-domain decoded synthesis from LP synthesis filter 103 with the modified time-domain synthesis from the LP synthesis filter 108 depending on the classification of the time-domain decoded synthesis before final de-emphasis and resampling to 16 kHz (for the example of AMR-WB) in a de-emphasizing filter and resampler 112.

In case of inactive speech, the only difference compared to active unvoiced speech modification is the use of a smoother 111 for smoothing the LP synthesis filter 108 to give smoother noise variation. The remaining modifications are the same as for the active unvoiced path. In the following text a more detailed example of implementation of the disclosed approach is described with reference to FIG. 2.

1) Signal Classification

Figure 2:
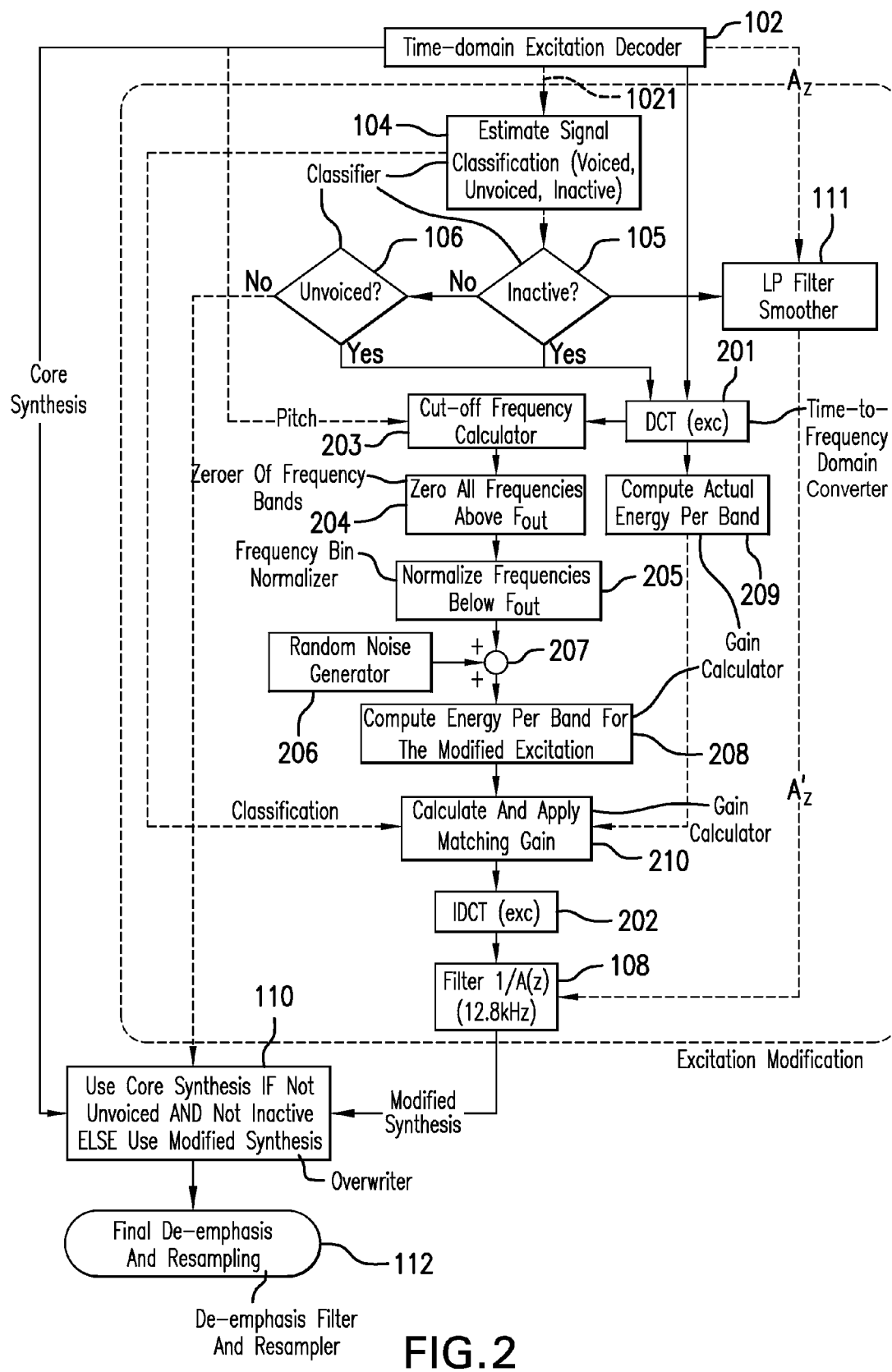
FIG. 2 is a detailed schematic diagram showing the CELP decoder modification for inactive and active unvoiced frames improvement.

Referring to FIG. 2, the classifier 104-105-106-301 performs at the decoder a classification of the time-domain synthesis 1021 of the speech/sound signal as described hereinabove for the bit rates where the modification is applied. For the purpose of simplification of the drawings, the LP synthesis filter 103 is not shown in FIG. 2. Classification at the decoder is similar to that as described in references [Milan Jelinek and Philippe Gournay; PCT Patent application WO03102921A1, "A method and device for efficient frame erasure concealment in linear predictive based speech codecs"] and [T. Vaillancourt et al., PCT Patent application WO2007073604A1, "Method and device for efficient frame erasure concealment in speech codecs"], of which the full contents are incorporated herein by reference, plus some adaption for the generic audio detection. The following parameters are used for the classification of the frames at the decoder: a normalized correlation $r_x$, a spectral tilt measure $e_t$, a pitch stability counter pc, a relative frame energy of the sound signal at the end of the current frame $E_s$, and a zero-crossing counter zc. The computation of these parameters which are used to classify the signal is explained below.

The normalized correlation $r_x$ is computed at the end of the frame based on the speech/sound signal time-domain synthesis $s_{out}(n)$. The pitch lag of the last sub-frame from the time-domain excitation decoder 102 is used. More specifically, the normalized correlation $r_x$ is computed pitch synchronously as follows:

$$r_x = \frac{\sum_{i=0}^{T-1} x(t+i)x(t+i-T)}{\sqrt{\sum_{i=0}^{T-1} x^2(t+i) \sum_{i=0}^{T-1} x^2(t+i-T)}}, \quad (1)$$

where $x(n)=s_{out}(n)$, T is the pitch lag of the last sub-frame, t=L−T, and L is the frame size. If the pitch lag of the last sub-frame is larger than 3N/2 (N being the sub-frame size), T is set to the average pitch lag of the last two sub-frames.

Therefore, the normalized correlation $r_x$ is computed using the speech/sound signal time-domain synthesis $s_{out}(n)$. For pitch lags lower than the sub-frame size (64 samples) the normalized correlation is computed twice at instants $t=L-T$ and $t=L-2T$, and the normalized correlation $r_x$ is given as the average of these two computations.

The spectral tilt parameter $e_t$ contains the information about the frequency distribution of energy. As a non limitative example, the spectral tilt at the decoder is estimated as the first normalized autocorrelation coefficient of the time-domain synthesis. It is computed based on the last 3 sub-frames as:

$$e_t = \frac{\sum_{i=N}^{L-1} x(i)x(i-1)}{\sum_{i=N}^{L-1} x^2(i)} \quad (2)$$

where $x(n)=s_{out}(n)$ is the time-domain synthesis signal, N is the sub-frame size, and L is the frame size (N=64 and L=256 in the example of AMR-WB).

The pitch stability counter pc assesses the variation of the pitch period. It is computed at the decoder as follows:

$$pc=|p_3+p_2-p_1-p_0| \quad (3)$$

The values $p_0$, $p_1$, $p_2$ and $p_3$ correspond to the closed-loop pitch lag from the 4 sub-frames of the current frame (in the example of AMR-WB).

The relative frame energy $E_s$ is computed as a difference between the current frame energy $E_f$ in dB and its long-term average $E_{lt}$ $$E_s=E_f-E_{lt} \quad (4)$$

where the current frame energy $E_f$ is the energy of the time-domain synthesis $s_{out}(n)$ in dB computed pitch synchronously at the end of the frame as $$E_f = 10\log_{10}\left(\frac{1}{T}\sum_{i=0}^{T-1} s_{out}^2(i+L-T)\right) \quad (5)$$

where L=256 (in the example of AMR-WB) is the frame length and T is the average pitch lag of the last two sub-frames. If T is less than the sub-frame size then T is set to 2T (the energy computed using two pitch periods for short pitch lags).

The long-term averaged energy is updated on active speech frames using the following relation:

$$E_{lt}=0.99E_{lt}+0.01E_f \quad (6)$$

The last parameter is the zero-crossing counter zc computed on one frame of the time-domain synthesis $s_{out}(n)$. As a non limitative example, the zero-crossing counter zc counts the number of times the sign of the time-domain synthesis changes from positive to negative during that interval.

To make the classification more robust, the classification parameters are considered together forming a function of merit fm. For that purpose, the classification parameters are first scaled using a linear function. Let us consider a parameter $p_x$, its scaled version is obtained using:

$$p^s=k_p \cdot p_x+c_p \quad (7)$$

The scaled pitch stability counter pc is clipped between 0 and 1. The function coefficients $k_p$ and $c_p$ have been found experimentally for each of the parameters. The values used in this example of implementation are summarized in Table 1:

TABLE 1

Frame Classification Parameters at the decoder and the coefficients of their respective scaling functions

| Parameter | Meaning | $k_p$ | $c_p$ |
|---|---|---|---|
| $r_x$ | Normalized Correlation | 0.8547 | 0.2479 |
| $e_t$ | Spectral Tilt | 0.8333 | 0.2917 |
| pc | Pitch Stability counter | −0.0357 | 1.6074 |
| $E_s$ | Relative Frame Energy | 0.04 | 0.56 |
| zc | Zero Crossing Counter | −0.04 | 2.52 |

The function of merit is defined as:

$$f_m = \frac{1}{6}(2 \cdot r_x^s + e_t^s + pc^s + E_s^s + zc^s) \quad (8)$$

where the superscript s indicates the scaled version of the parameters.

The classification of the frames is then done using the function of merit $f_m$ and following the rules summarized in Table 2:

TABLE 2

Signal Classification Rules at the decoder

| Previous Frame Class | Rule | Current Frame Class |
|---|---|---|
| ONSET VOICED VOICED TRANSITION ARTIFICIAL ONSET GENERIC AUDIO SOUND | $f_m \geq 0.63$ | VOICED |
|  | $0.39 \leq f_m < 0.63$ | VOICED TRANSITION |
|  | $f_m < 0.39$ | UNVOICED |
| UNVOICED TRANSITION UNVOICED | $f_m > 0.56$ | ONSET |
|  | $0.56 \geq f_m > 0.45$ | UNVOICED TRANSITION |
|  | $f_m \leq 0.45$ | UNVOICED |
| Current frame VAD information | VAD = 0 | UNVOICED |

In addition to this classification, the information 109 on the voice activity detection (VAD) by the encoder can be transmitted into the bitstream 101 (FIG. 1) as it is the case with the example of AMR-WB. Thus, one bit is sent into the bitstream 101 to specify whether or not the encoder considers the current frame as active content (VAD=1) or inactive content (background noise, VAD=0). When the VAD information indicates that the content is inactive, the classifier portion 104, 105, 106 and 301 then overwrites the classification as UNVOICED.

Figure 3:
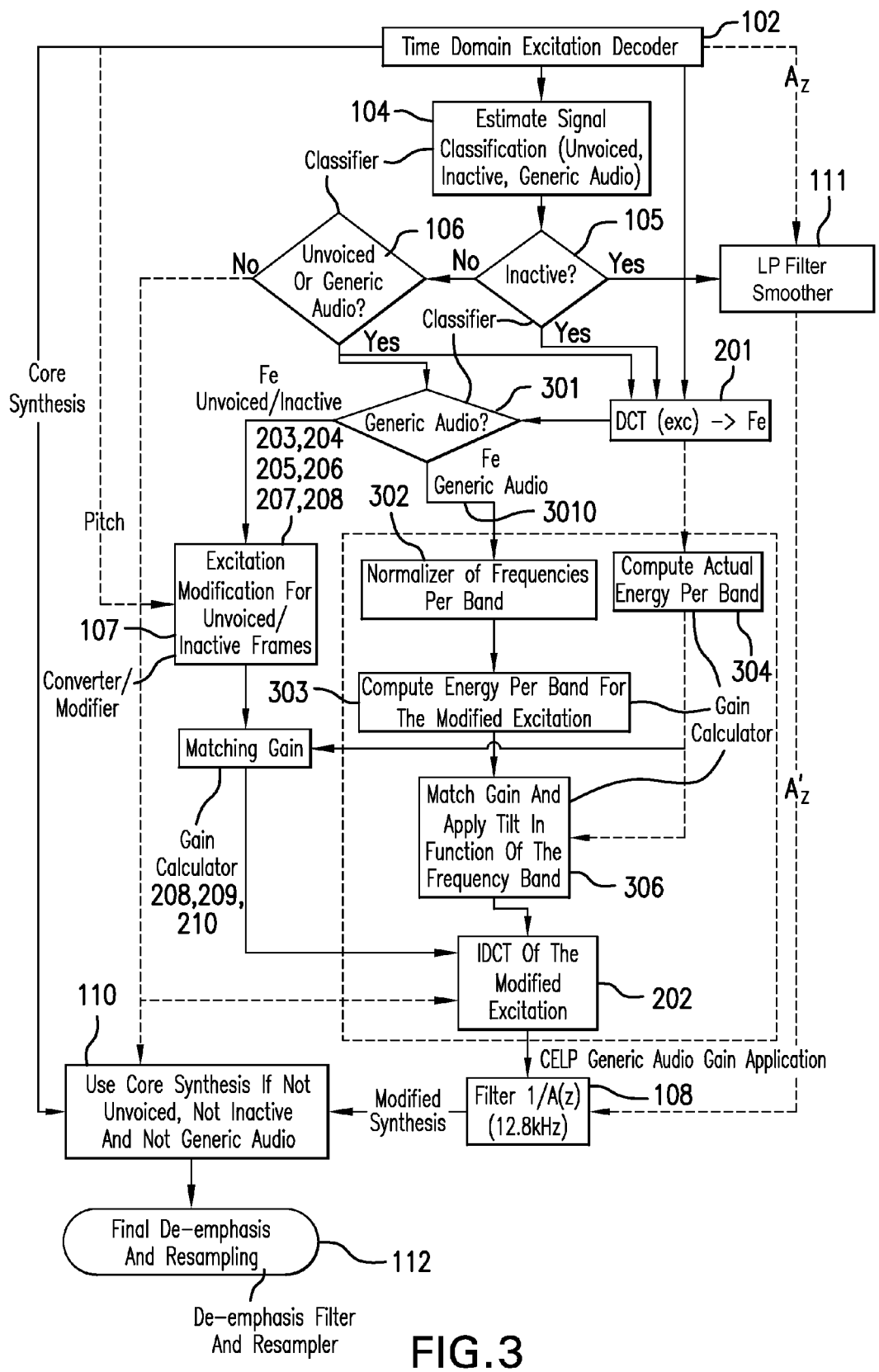
FIG. 3 is a simplified schematic diagram showing modification of a CELP decoder for generic audio frames improvement.

The classification scheme also includes a generic audio detection (see classifier portion 301 of FIG. 3). The generic audio category includes music, reverberant speech and can also include background music. A second step of classification allows the classifier 104-105-106-301 to determine with good confidence that the current frame can be categorized as generic audio. Two parameters are used to realize this second classification step. One of the parameters is the total frame energy $E_f$ as formulated in Equation (5).

First, a mean of the past forty (40) total frame energy variations $\overline{E}_{df}$ is calculated using the following relation:

$$\overline{E}_{df} = \frac{\sum_{t=-40}^{t=-1} \Delta_E^t}{40}; \text{ where } \Delta_E^t = E_f^t - E_f^{(t-1)} \qquad (9)$$

Then, a statistical deviation of the energy variation history $\sigma_E$ over the last fifteen (15) frames is determined using the following relation:

$$\sigma_E = 0.77459647 \cdot \sqrt{\sum_{t=-15}^{t=-1} \frac{(\Delta_E^t - \overline{E}_{df})^2}{15}} \qquad (10)$$

The resulting deviation $\sigma_E$ gives an indication on the energy stability of the decoded synthesis. Typically, music has a higher energy stability (lower statistical deviation of the energy variation history) than speech.

Additionally, the first step classification is used to evaluate the interval between two frames classified as unvoiced $N_{UV}$ when the frame energy $E_f$, as formulated in equation (5) is higher than −12 dB. When a frame is classified as unvoiced and the frame energy $E_f$ is greater than −9 dB, meaning that the signal is unvoiced but not silence, if the long term active speech energy $E_{lt}$, as formulated in Equation (6), is below 40 dB the unvoiced interval counter is set to 16, otherwise the unvoiced interval counter $N_{UV}$ is decreased by 8. The counter $N_{UV}$ is also limited between 0 and 300 for active speech signal and between 0 and 125 for inactive speech signal. It is reminded that, in the illustrative example, the difference between active and inactive speech signal may be deduced from the voice activity detection VAD information included in the bitstream 101.

A long term average is derived from this unvoiced frame counter as follow for active speech signal:

$$N_{uv_{lt}} = 0.9 \cdot N_{uv_{lt}} + 0.1 \cdot N_{uv} \qquad (11)$$

And as follows for inactive speech signal:

$$N_{uv_{lt}} = 0.95 \cdot N_{uv_{lt}} \qquad (12)$$

Furthermore, when the long term average is very high and the deviation $\sigma_E$ is high, for example when $N_{UV_{lt}} > 140$ and $\sigma_E > 5$ in the current example of implementation, the long term average is modified as follow:

$$N_{uv_{lt}} = 0.2 \cdot N_{uv_{lt}} + 80 \qquad (13)$$

This parameter on long term average of the number of frames between frames classified as unvoiced is used by the classifier 104-105-106-301 to determine if the frame should be considered as generic audio or not. The more the unvoiced frames are close in time, the more likely the frame has speech characteristics (less probably generic audio). In the illustrative example, the threshold to decide if a frame is considered as generic audio $G_A$ is defined as follows:

A frame is $G_A$ if: $N_{uv_{lt}} > 140$ and $\Delta_E^t < 12$ (14)

The parameter $\Delta_E^t$, defined in equation (9), is added to not classify large energy variation as generic audio, but to keep it as active speech.

The modification performed on the excitation depends on the classification of the frame and for some type of frames there is no modification at all. The next table 3 summarizes the case where a modification can be performed or not.

TABLE 3

Signal category for excitation modification

| Frame Classification | Voice activity detected? Y/N | Category | Modification Y/N |
|---|---|---|---|
| ONSET | Y | Active voice | N |
| VOICED | (VAD = 1) | | |
| UNVOICED TRANSITION | | | |
| ARTIFICIAL ONSET | | | |
| GENERIC AUDIO SOUND | Y | Generic audio | Y* |
| VOICED TRANSITION | Y | Active unvoiced | Y |
| UNVOICED | | | |
| ONSET | N | Inactive audio | Y |
| VOICED | | | |
| UNVOICED TRANSITION | | | |
| ARTIFICIAL ONSET | | | |
| GENERIC AUDIO SOUND | | | |
| VOICED TRANSITION | | | |
| UNVOICED | | | |

The generic audio category may be modified or not depending on the implementation. For example, generic audio may be modified only when inactive, or generic audio may be modified only when active, all the time or not at all.

2) Frequency Transform

During the frequency-domain modification phase, the excitation needs to be represented into the transform-domain. For example, the time-to-frequency conversion is achieved by a time-to-frequency domain converter 201 of the converter/modifier 107 using a type II DCT (Discrete Cosine Transform) giving a frequency resolution of 25 Hz but any other suitable transform can be used. In case another transform is used the frequency resolution (defined above), the number of frequency bands and the number of frequency bins per bands (defined further below) may need to be revised accordingly. The frequency representation of the time-domain CELP excitation $f_e$ calculated in the time-to-frequency domain converter 201 is given below:

$$f_e(k) = \begin{cases} \sqrt{\dfrac{1}{L}} \cdot \sum_{n=0}^{L-1} e_{td}(n), & k = 0 \\ \sqrt{\dfrac{2}{L}} \cdot \sum_{n=0}^{L-1} e_{td}(n) \cdot \cos\left(\dfrac{\pi}{L}\left(n + \dfrac{1}{2}\right)k\right), & 1 \le k \le L-1 \end{cases} \qquad (15)$$

Where $e_{td}(n)$ is the time-domain CELP excitation, and L is the frame length. In the example of AMR-WB, the frame length is 256 samples for a corresponding inner sampling frequency of 12.8 kHz.

In a time-domain CELP decoder such as 102, the time-domain excitation signal is given by $$e_{td}(n) = bv(n) + gc(n) \qquad (15a)$$

where v(n) is the adaptive codebook contribution, b is the adaptive codebook gain, c(n) is the fixed codebook contribution, g is the fixed codebook gain.

3) Energy Per Band Analysis

Before any modification to the time-domain excitation, the converter/modifier 107 comprises a gain calculator 208-209-210 itself including a sub-calculator 209 to compute the energy per band $E_b$ of the frequency-domain excitation and keeps the computed energy per band $E_b$ in memory for energy adjustment after the excitation spectrum reshaping. For a 12.8 kHz sampling frequency, the energy can be computed by the sub-calculator 209 as follows:

$$E_b(i) = \sqrt{\sum_{j=C_{Bb}(i)}^{j=C_{Bb}(i)+B_b(i)} f_e(j)^2} \quad (16)$$

where $C_{Bb}$ represents the cumulative frequency bins per band and $B_b$ the number of bins per frequency band defined as:

$B_b = \{4, 4, 4, 4, 4, 5, 6, 6, 6, 8, 8,$ $\quad 10, 11, 13, 15, 18, 22, 16, 16, 20, 20, 20, 16\}$ $C_{Bb} = \{0, 8, 12, 16, 20, 25, 31, 37, 43, 51, 59, 69,$ $\quad 80, 93, 108, 126, 148, 164, 180, 200, 220, 240\}$ The low frequency bands may correspond to the critical audio bands as described in [Milan Jelinek and Philippe Gournay. PCT Patent application WO03102921A1, "A method and device for efficient frame erasure concealment in linear predictive based speech codecs"], of which the full content is incorporated herein by reference, but the frequency bands above 3700 Hz may be a little shorter to better match the possible spectral energy variation in those bands. Any other configuration of spectral bands is also possible.

4) Excitation Modification for Inactive and Active Unvoiced Frames a) Cut Off Frequency of the Time-Domain Contribution Versus Noise Fill To achieve a transparent switching between the non-modified excitation and the modified excitation for inactive frames and active unvoiced frames, at least the lower frequencies of the time-domain excitation contribution are kept. The converter/modifier 107 comprises a cut-off frequency calculator 203 to determine a frequency where the time-domain contribution stop to be used, the cut-off frequency $f_c$, having a minimum value of 1.2 kHz. This means that the first 1.2 kHz of the decoded excitation is always kept and depending on the decoded pitch value from the time-domain excitation decoder 102, this cut-off frequency can be higher. The $8^{th}$ harmonic is computed from the lowest pitch of all sub-frames and the time-domain contribution is kept up to this $8^{th}$ harmonic. An estimate of the $8^{th}$ harmonic is calculated as follows:

$$h_{8th} = \frac{(8 \cdot F_s)}{\min_{0 \le i < N_{sub}}(T(i))} \quad (17)$$

where $F_s = 12800$ Hz, $N_{sub}$ is the number of sub-frames and T is the decoded sub-frame pitch. For all $i < N_b$ where $N_b$ is the maximum frequency band included in frequency range $L_f$, a verification is made to find the band in which the $8^{th}$ harmonic is located by searching for the highest band for which the following inequality is still verified:

$(h_{8th} \ge L_f(i)) \quad (18)$ where $L_f$ is defined as:

$L_f = \{175, 275, 375, 475, 600, 750, 900, 1050, 1250, 1450, 1700, 1975,$ $\quad 2300, 2675, 3125, 3675, 4075, 4475, 4975, 5475, 5975, 6375\}$ The index of that frequency band in $L_f$ will be called $i_{8th}$ and it indicates the frequency band where the $8^{th}$ harmonic is likely to be located. The calculator cut-off frequency calculator 203 computes the final cut-off frequency $f_{tc}$ as the higher frequency between 1.2 kHz and the last frequency of the frequency band in which the $8^{th}$ harmonic is likely to be located ($L_f(i_{8th})$), using the following relation:

$f_{tc} = \max(L_f(i_{8th}), 1.2 \text{ kHz}) \quad (19)$ b) Normalization and Noise Fill The converter/modifier 107 further comprises a zeroer 204 that zeroes the frequency bins of the frequency bands above the cut-off frequency $f_c$.

For inactive frames and active unvoiced frames, a normalizer 205 of the converter/modifier 107 normalizes the frequency bins below of the frequency bands of the frequency representation of the time-domain CELP excitation $f_e$ between [0, 4] using the following relation:

$$f_{eN}(j) = \begin{cases} \dfrac{4 \cdot f_e(j)}{\max\limits_{0 \le i < f_c}(|f_e(i)|)}, & \text{for } 0 \le j < f_c \\ 0, & \text{for } f_c \le j < 256 \end{cases} \quad (20)$$

Then, the converter/modifier 107 comprises a random noise generator 206 to generate random noise and a simple noise fill is performed through an adder 207 to add noise over all the frequency bins at a constant level. The function describing the noise addition is defined below as:

for $j = 0 : L-1$ $f'_{eN}(j) = f_{eN}(j) + 0.75 \cdot \text{rand}() \quad (21)$ where rand is a random number generator which is limited between −1 to 1.

c) Energy Per Band Analysis of the Modified Excitation Spectrum

Sub-calculator 208 of the gain calculator 208-209-210 determines the energy per band after the spectrum reshaping $E_b'$ using the same method as described in above section 3.

d) Energy Matching

For inactive frames and active unvoiced frames, the energy matching consists only in adjusting the energy per band after the excitation spectrum modification to its initial value. For each band i, sub-calculator 210 of the gain calculator 208-209-210 determines a matching gain $G_b$ to apply to all bins in the frequency band for matching the energy as follows:

$$G_b(i) = \frac{E_b(i)}{E_b'(i)} \quad (22)$$

where $E_b(i)$ is the energy per band before excitation spectrum modification as determined in sub-calculator 209 using the method of above section 3 and $E'_b(i)$ is the energy per band after excitation spectrum modification as calculated in sub-calculator 208. For a specific band i, the modified (de-normalized) frequency-domain excitation $f'_{edN}$ as determined in sub-calculator 210 can be written as:

for $C_{Bb}(i) \le j < C_{Bb}(i) + B_b(i)$ $f'_{edN}(j) = G_b(i) \cdot f'_{eN}(j) \quad (23)$ where $C_{Bb}$ and $B_b$ are defined in above section 3.

5) Excitation Modification for Generic Audio Frames a) Normalization and Noise Fill Reference will now be made to FIG. 3. For generic audio frames as determined by the classifier portion 301, the normalization is slightly different and performed by a normalizer 302. First the normalization factor $N_f$ changes from band to band, using a higher value for low frequency bands and a lower value for high frequency bands. The idea is to allow for higher amplitude in the low frequency bands where the location of the pulses is more accurate and lower amplitude in the higher frequency bands where the location of the pulses is less accurate. In this illustrative example, the varying normalization factor $N_f$ by frequency band is defined as:

$N_f$={16, 16, 16, 16, 16, 16, 16, 12, 12, 12, 12, 8, 8, 8, 8, 8, 4, 4, 2, 2, 1, 1, 1}

For a specific frequency band i, the normalization of the frequency representation of the time-domain excitation (frequency-domain excitation) $f_e$ of generic audio frames can be described as follow:

$$f_{eN}(j) = \frac{N_f(i) \cdot f_e(j)}{\max_{k=C_{Bb}(i)}^{C_{Bb}(i)+B_b(i)}(|f_e(k)|)}, \text{ for } C_{Bb}(i) \leq j < C_{Bb}(i) + B_b(i) \quad (24)$$

Where $B_b$ is the number of bins per frequency band, the cumulative frequency bins per bands is $C_{Bb}$ and $f_{eN}(j)$ is the normalized frequency-domain excitation. $B_b$ and $C_{Bb}$ are described in the above section 3.

Furthermore, the normalizer 302 comprises a zeroer (not shown) to zero all the frequency bins below a fraction $Z_f$ of the maximum value of $f_{eN}(j)$ in each frequency band to obtain $f'_{eN}(j)$:

$$f'_{eN}(j) = \begin{cases} 0 & \text{if } (f_{eN}(j) < Z_f(i)) \\ f_{eN}(j) & \text{otherwise} \end{cases} \bigg|_{\text{for } C_{Bb}(i) \leq j < C_{Bb}(i)+B_b(i)} \quad (25)$$

where $Z_f$ can be represented as:
$Z_f$={1, 1, 1, 1, 1, 1, 1, 1, 1, 1, 1, 1, 1, 1, 1, 1, 1, 1, 1, 0.5, 0.5, 0.5}

A more aggressive zeroing can be performed by increasing the value of the vector $Z_f$, if it is desired to increase the peakyness of the spectrum.

b) Energy Per Band Analysis of the Modified Excitation Spectrum

Calculator portion 303 of a gain calculator 303-304-306 determines the energy per band after spectrum reshaping $E_b'$ using the same method as described in above section 3.

c) Energy Matching

Figure 4:
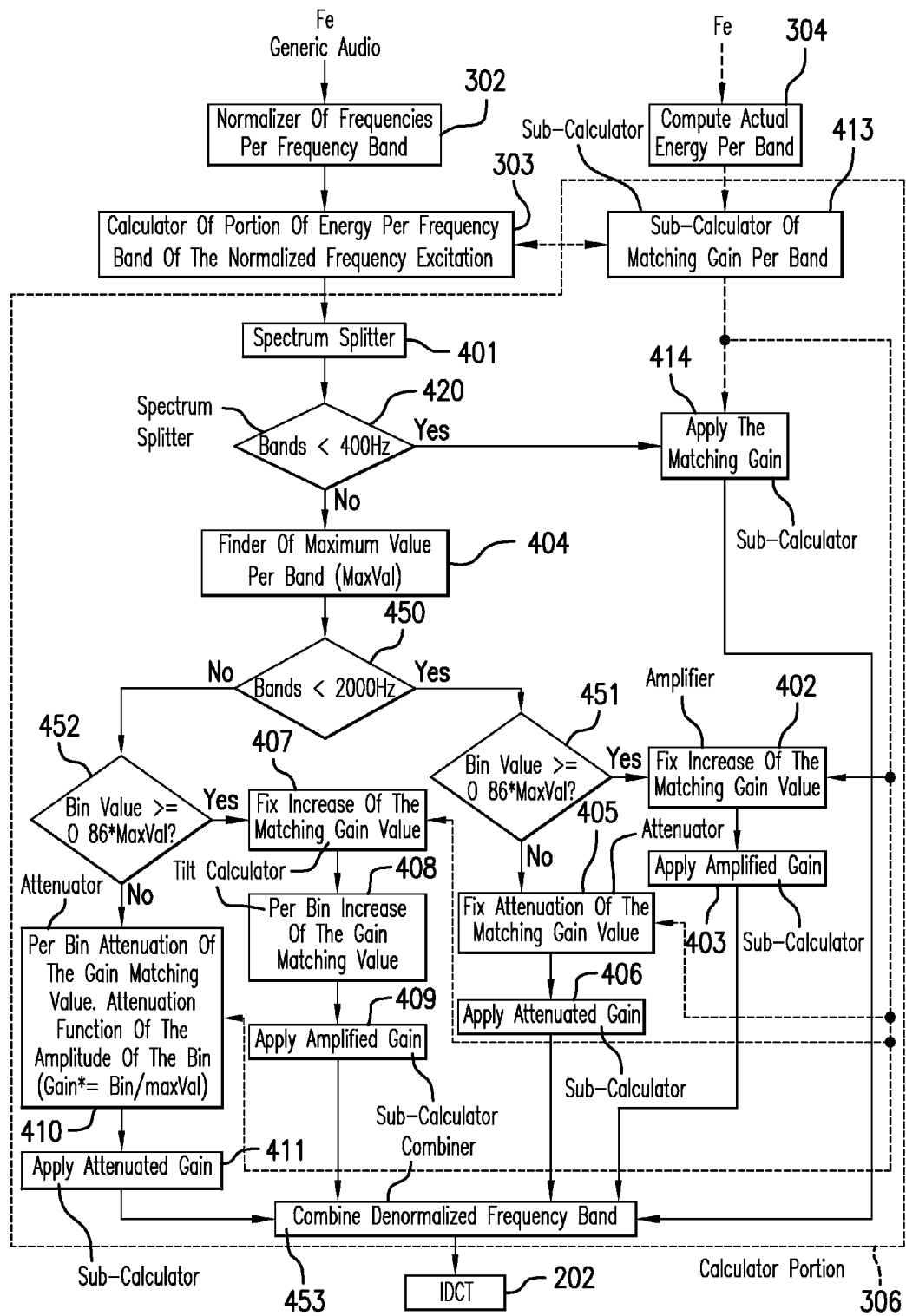
FIG. 4 is a detailed schematic diagram showing the CELP decoder modification for generic audio frames improvement.

FIG. 3 shows the gain calculator 303-304-306 and FIG. 4 describes in more detail calculator portion 306 of this gain calculator.

For generic audio frames, the energy matching is trickier since it aims at increasing the spectral dynamic as well. For each frequency band i, a sub-calculator 413 of calculator portion 306 of the gain calculator 303-304-306 computes an estimated gain $G_e$ defined similarly as in equation (22):

$$G_e(i) = \frac{E_b(i)}{E_b'(i)} \quad (26)$$

where $E_b(i)$ is the energy per band before excitation spectrum modification as determined in calculator portion 304 using the method as described in above section 3, and $E'_b(i)$ is the energy per band after excitation spectrum modification as calculated in calculator portion 303.

A sub-calculator 414 of the calculator portion 306 applies the gain $G_e$ to the first 400 Hz (or first 4 bands) of the normalized frequency-domain excitation $f'_{eN}$ from the normalizer 302 and spectrum splitter 401-420 to provide a modified (de-normalized) frequency-domain excitation $f'_{edN}$ using the following relation:

$$f'_{edN}(j) = G_e(i) \cdot f'_{eN}(j), \text{ for } C_{Bb}(i) \leq j < C_{Bb}(i) + B_b(i)|_{0 \leq i < 4} \quad (27)$$

A finder 404 determines the maximum value $\max_{a \leq j < b}(|f_{eN}(j)|)$ per band i above 400 Hz, where $a = C_{Bb}(i)$ and $b = C_{Bb}(i) + B_b(i)$ are defined in above section 3.

For the frequency bands comprised between 400 Hz and 2 kHz (bands 4 to 12) of the normalized frequency-domain excitation (see module 420 and 450), if the normalized frequency-domain excitation in a frequency bin $f'_{eN}(j) \geq 0.86 \max_{a \leq j < b}(|f_{eN}(j)|)$ (see module 451), an amplifier 402 amplifies the gain $G_e$ from the sub-calculator 413 by a factor 1.1 as shown in the upper line of Equation (28). A sub-calculator 403 applies the amplified gain from amplifier 402 to the normalized spectral excitation $f'_{en}$ in the frequency bin according to the first line of Equation (28) to obtain the modified (de-normalized) frequency-domain excitation $f'_{edN}$.

Again for the frequency bands comprised between 400 Hz and 2 kHz (bands 4 to 12) of the normalized frequency-domain excitation (see module 420 and 450), if the normalized frequency-domain excitation in a frequency bin $f'_{eN}(j) < 0.86 \max_{a \leq j < b}(|f_{eN}(j)|)$ (see module 451), an attenuator 405 attenuates the gain $G_e$ rom the sub-calculator 413 by a factor 0.86 as shown in the lower line of Equation (28). A sub-calculator 406 applies the attenuated gain from attenuator 405 to the normalized spectral excitation $f'_{eN}$ in the frequency bin according to the lower line of Equation (28) to obtain the modified (de-normalized) frequency-domain excitation $f'_{edN}$ To summarize, the modified (de-normalized) spectral excitation $f'_{edN}$ is given as follows:

$$f'_{edN}(j) = \begin{cases} 1.1 \cdot G_e(i) \cdot f'_{eN}(j), & \text{if } f'_{eN}(j) \geq 0.86 \cdot \max_{a \leq j < b}(|f_{eN}(j)|) \\ 0.86 \cdot G_e(i) \cdot f'_{eN}(j), & \text{if } f'_{eN}(j) < 0.86 \cdot \max_{a \leq j < b}(|f_{eN}(j)|) \end{cases} \quad (28)$$

Finally for higher parts of the spectrum, in this example the frequency bands above 2 kHz (bands >12) of the normalized frequency-domain excitation (see module 420 and 450), if the normalized frequency-domain excitation in a frequency bin $f'_{eN}(j) \geq 0.86 \max_{a \leq j < b}("f_{eN}(j)|)$ (see module 452), a tilt which is a function of the frequency band i and which can also be a function of the bit rate is added to the gain $G_e$ to compensate for the too low energy estimation of the LPC filter. The value of the tilt per frequency band $\delta(i)$ is formulated as:

$$\delta(i) = 1.5 \cdot G_e(i) \cdot \frac{(j-12)}{32} \quad (29)$$

The tilt is calculated by tilt calculator 407-408 and is applied to the normalized frequency-domain excitation $f'_{eN}$ by frequency bin according to the upper line of Equation (30) by a sub-calculator 409 to obtain the modified (de-normalized) frequency-domain excitation $f'_{edN}$ Again for higher parts of the spectrum, in this illustrative example the frequency bands above 2 kHz (bands >12) of the normalized frequency-domain excitation (see module 420 and 450), if the normalized frequency-domain excitation in a frequency bin $f'_{eN}(j) < 0.86 \max_{a \leq j < b}(|f_{eN}(j)|)$ (see module 452), an attenuator 410 calculates an attenuation gain [$f'_{eN}$ (j))/$\max_{a \leq j < b}(|f_{eN}(j)|)]^2$ applied to the normalized spectral excitation $f'_{en}$, by frequency bin according to the lower line of Equation (30) by a sub-calculator 411 to obtain the modified (de-normalized) frequency-domain excitation $f'_{edN}$ To summarize, the denormalized spectral excitation $f'_{edN}$ is determined as follows:

$$f'_{edN}(j) = \begin{cases} \delta(i) \cdot f'_{eN}(j), & \text{if } f'_{eN}(j) \geq 0.86 \cdot \max_{a \leq j < b}(|f_{eN}(j)|) \\ \frac{f'_{eN}(j)}{\max_{a \leq j < b}(|f_{eN}(j)|)} \cdot f'_{eN}(j), & \text{otherwise} \end{cases} \quad (30)$$

where a and b are described herein above. It is also possible to further increase the gain applied to the latest bands, where the energy matching of the LPC is the worst.

6) Inverse Frequency Transform

A combiner 453 combines the contributions to the modified (de-normalized) frequency-domain excitation $f'_{edN}$ from the sub-calculators 414, 403, 406, 409 and 411 to form the complete modified (de-normalized) frequency-domain excitation $f'_{edN}$ After the frequency domain processing is completed, an inverse frequency-time transform 202 is applied to the modified (de-normalized) frequency-domain excitation $f'_{edN}$ from combiner 453 to find the time-domain modified excitation. In this illustrative embodiment, the frequency-to-time conversion is achieved with the inverse of the same type II DCT as used for the time-to-frequency conversion giving a resolution of 25 Hz. Again, any other transforms can be used. The modified time-domain excitation $e'_{td}$ is obtained as below:

$$e'_{td}(k) = \begin{cases} \sqrt{\frac{1}{L}} \cdot \sum_{n=0}^{L-1} f'_{edN}(n), & k = 0 \\ \sqrt{\frac{2}{L}} \cdot \sum_{n=0}^{L-1} f'_{edN}(n) \cdot \cos\left(\frac{\pi}{L}\left(n + \frac{1}{2}\right)k\right), & 1 \leq k \leq L-1 \end{cases} \quad (31)$$

Where $f'_{edN}(n)$ is the frequency representation of the modified excitation, and L is the frame length. In this illustrative example, the frame length is 256 samples for a corresponding inner sampling frequency of 12.8 kHz (AMR-WB).

7) Synthesis Filtering and Overwriting the Current CELP Synthesis

Once the excitation modification is completed, the modified excitation is processed through the synthesis filter 108 to obtain a modified synthesis for the current frame. The overwriter 110 uses this modified synthesis to overwrite the decoded synthesis thus to increase the perceptual quality.

Final de-emphasis and resampling to 16 kHz can then be performed in de-emphasis filter and resampler 112.

What is claimed is:

1. A device for modifying a synthesis of a time-domain code-excited linear prediction (CELP) excitation decoded by a time-domain CELP decoder, comprising:
   at least one processor; and
   a memory coupled to the processor and comprising non-transitory instructions that when executed cause the processor to implement:
      a classifier of the synthesis of the decoded time-domain CELP excitation into one of a number of categories;
      a first converter of the decoded time-domain CELP excitation into a frequency-domain excitation;
      a modifier of the frequency-domain excitation as a function of the category in which the synthesis of the decoded time-domain CELP excitation is classified by the classifier;
      a second converter of the modified frequency-domain excitation into a modified time-domain CELP excitation; and
      a first linear prediction synthesis filter supplied with the modified time-domain CELP excitation to produce a modified synthesis of the decoded time-domain CELP excitation.

2. A device for modifying a synthesis of a time-domain CELP excitation according to claim 1, wherein the modifier comprises:
   a first calculator of a cut-off frequency where a time-domain excitation contribution stops to be used.

3. A device for modifying a synthesis of a time-domain CELP excitation according to claim 2, wherein the modifier comprises:
   a zeroer of the frequency-domain excitation above the cut-off frequency; and
   a normalizer of the frequency-domain excitation below the cut-off frequency to produce a normalized frequency-domain excitation.

4. A device for modifying a synthesis of a time-domain CELP excitation according to claim 3, wherein the modifier comprises:
   a random noise generator; and
   an adder of the random noise to the normalized frequency-domain excitation.

5. A device for modifying a synthesis of a time-domain CELP excitation according to claim 3, wherein the modifier comprises:
   a second calculator of a matching gain using an energy of the frequency-domain excitation before and after modification, the second calculator applying the matching gain to the normalized frequency-domain excitation to produce the modified frequency-domain excitation.

6. A device for modifying a synthesis of a time-domain CELP excitation according to claim 2, wherein the classifier classifies the synthesis of the decoded time-domain CELP excitation as inactive or active unvoiced.

7. A device for modifying a synthesis of a time-domain CELP excitation according to claim 1, wherein the memory comprises non-transitory instructions that when executed cause the processor to implement:
   a smoother of the first linear prediction synthesis filter when the synthesis of the decoded time-domain CELP excitation is classified as a given one of the categories by the classifier.

8. A device for modifying a synthesis of a time-domain CELP excitation according to claim 1, wherein the frequency-domain excitation is divided into frequency bands each divided into frequency bins, and wherein the modifier comprises:
   a normalizer of the frequency-domain excitation using a frequency band-varying normalization factor to produce a normalized frequency-domain excitation.

9. A device for modifying a synthesis of a time-domain CELP excitation according to claim 8, wherein the normalizer comprises:
   a zeroer of the frequency bins below a fraction of a maximum value of the normalized frequency-domain excitation in the frequency band comprising the frequency bins.

10. A device for modifying a synthesis of a time-domain CELP excitation according to claim 8, wherein the modifier comprises:
a first calculator of a matching gain per frequency band using an energy of the frequency-domain excitation before and after modification.

11. A device for modifying a synthesis of a time-domain CELP excitation according to claim 10, wherein the modifier comprises, for the frequency bands below a first frequency:
a second calculator for applying the matching gain to the normalized frequency-domain excitation to produce the modified frequency-domain excitation.

12. A device for modifying a synthesis of a time-domain CELP excitation according to claim 10, wherein, for the frequency bands between a first lower frequency and a second higher frequency, the memory comprises non-transitory instructions that when executed cause the processor to implement:
a finder of a maximum value per frequency band of the normalized frequency-domain excitation;
an amplifier for amplifying the matching gain by an amplification factor per frequency bin when the normalized frequency-domain excitation in the frequency bin is equal to or higher than a value proportional to said maximum value of the frequency band; and
a second calculator for applying the amplified matching gain to the normalized frequency-domain excitation in the frequency bin to produce in said frequency bin the modified frequency-domain excitation.

13. A device for modifying a synthesis of a time-domain CELP excitation according to claim 10, wherein, for the frequency bands between a first lower frequency and a second higher frequency, the memory comprises non-transitory instructions that when executed cause the processor to implement:
a finder of a maximum value per frequency band of the normalized frequency-domain excitation;
an attenuator for attenuating the matching gain by an attenuation factor per frequency bin of the frequency band when the normalized frequency-domain excitation in the frequency bin is lower than a value proportional to said maximum value of the frequency band; and
a second calculator for applying the attenuated matching gain to the normalized frequency-domain excitation in said frequency bin to produce in said frequency bin the modified frequency-domain excitation.

14. A device for modifying a synthesis of a time-domain CELP excitation according to claim 10, wherein, for the frequency bands above a given frequency, the memory comprises non-transitory instructions that when executed cause the processor to implement:
a finder of a maximum value per frequency band of the normalized frequency-domain excitation;
a second calculator of a tilt for the matching gain when the normalized frequency-domain excitation in the frequency bin is higher than a value proportional to said maximum value of the frequency band, the second calculator applying the calculated tilt to the matching gain; and
a third calculator for applying the matching gain to which the calculated tilt has been applied to the normalized frequency-domain excitation in said frequency bin to produce in said frequency bin the modified frequency-domain excitation.

15. A device for modifying a synthesis of a time-domain CELP excitation according to claim 10, wherein, for the frequency bands above a given frequency, the memory comprises non-transitory instructions that when executed cause the processor to implement:
a finder of a maximum value per frequency band of the normalized frequency-domain excitation;
an attenuator for attenuating the matching gain by an amplification factor per frequency bin of the frequency band when the normalized frequency-domain excitation in the frequency bin is lower than a value proportional to the maximum value of the frequency band; and
a second calculator for applying the attenuated matching gain to the normalized frequency-domain excitation in said frequency bin to produce in said frequency bin the modified frequency-domain excitation.

16. A device for decoding a sound signal encoded by encoding parameters, comprising:
a decoder of a time-domain CELP excitation in response to the sound signal encoding parameters;
a second synthesis filter responsive to the decoded time-domain CELP excitation to produce a synthesis of said time-domain CELP excitation; and
a device according to claim 1, for modifying the synthesis of the time-domain CELP excitation.

17. A method for modifying a synthesis of a time-domain code-excited linear prediction (CELP) excitation decoded by a time-domain CELP decoder, comprising:
classifying the synthesis of the decoded time-domain CELP excitation into one of a number of categories;
converting the decoded time-domain CELP excitation into a frequency-domain excitation;
modifying the frequency-domain excitation as a function of the category in which the synthesis of the decoded time-domain CELP excitation is classified;
converting the modified frequency-domain excitation into a modified time-domain CELP excitation;
synthesizing, using a linear prediction synthesis filter, the modified time-domain CELP excitation to produce a modified synthesis of the decoded time-domain CELP excitation.

18. A method for modifying a synthesis of a time-domain CELP excitation according to claim 17, wherein modifying the frequency-domain excitation comprises:
calculating a cut-off frequency where a time-domain excitation contribution stops to be used.

19. A method for modifying a synthesis of a time-domain CELP excitation according to claim 18, wherein modifying the frequency-domain excitation comprises:
zeroing the frequency-domain excitation above the cut-off frequency; and
normalizing the frequency-domain excitation below the cut-off frequency to produce a normalized frequency-domain excitation.

20. A method for modifying a synthesis of a time-domain CELP excitation according to claim 19, wherein modifying the frequency-domain excitation comprises generating a random noise and adding the random noise to the normalized frequency-domain excitation.

21. A method for modifying a synthesis of a time-domain CELP excitation according to claim 19, wherein modifying the frequency-domain excitation comprises:
calculating a matching gain using an energy of the frequency-domain excitation before and after modification, and applying the matching gain to the normalized frequency-domain excitation to produce the modified frequency-domain excitation.

22. A method for modifying a synthesis of a time-domain CELP excitation according to claim 18, wherein the synthesis of the decoded time-domain CELP excitation is classified as inactive or active unvoiced.

23. A method for modifying a synthesis of a time-domain CELP excitation according to claim 17, comprising smoothing the linear prediction synthesis filter performing the synthesis of the modified time-domain CELP excitation when the synthesis of the decoded time-domain CELP excitation is classified as a given one of the categories by a classifier.

24. A method for modifying a synthesis of a time-domain excitation according to claim 17, wherein the frequency-domain excitation is divided into frequency bands each divided into frequency bins, and wherein modifying the frequency-domain excitation comprises:
  normalizing the frequency-domain excitation using a frequency band-varying normalization factor to produce a normalized frequency-domain excitation.

25. A method for modifying a synthesis of a time-domain CELP excitation according to claim 24, wherein modifying the frequency-domain excitation comprises zeroing the frequency bins below a fraction of a maximum value of the normalized frequency-domain excitation in the frequency band comprising the frequency bins.

26. A method for modifying a synthesis of a time-domain CELP excitation according to claim 24, wherein modifying the frequency-domain excitation comprises:
  calculating a matching gain per frequency band using an energy of the frequency-domain excitation before and after modification.

27. A method for modifying a synthesis of a time-domain CELP excitation according to claim 26, wherein modifying the frequency-domain excitation comprises, for the frequency bands below a first frequency, applying the matching gain to the normalized frequency-domain excitation to produce the modified frequency-domain excitation.

28. A method for modifying a synthesis of a time-domain CELP excitation according to claim 26, comprising, for the frequency bands between a first lower frequency and a second higher frequency:
  finding a maximum value per frequency band of the normalized frequency-domain excitation;
  amplifying the matching gain by an amplification factor per frequency bin when the normalized frequency-domain excitation in the frequency bin is equal to or higher than a value proportional to said maximum value of the frequency band; and
  applying the amplified matching gain to the normalized frequency-domain excitation in the frequency bin to produce in said frequency bin the modified frequency-domain excitation.

29. A method for modifying a synthesis of a time-domain CELP excitation according to claim 26, comprising, for the frequency bands between a first lower frequency and a second higher frequency:
  finding a maximum value per frequency band of the normalized frequency-domain excitation;
  attenuating the matching gain by an attenuation factor per frequency bin of the frequency band when the normalized frequency-domain excitation in the frequency bin is lower than a value proportional to said maximum value of the frequency band; and
  applying the attenuated matching gain to the normalized frequency-domain excitation in said frequency bin to produce in said frequency bin the modified frequency-domain excitation.

30. A method for modifying a synthesis of a time-domain CELP excitation according to claim 26, comprising, for the frequency bands above a given frequency:
  finding a maximum value per frequency band of the normalized frequency-domain excitation;
  calculating a tilt for the matching gain when the normalized frequency-domain excitation in the frequency bin is higher than a value proportional to said maximum value of the frequency band, and applying the calculated tilt to the matching gain; and
  applying the matching gain to which the calculated tilt has been applied to the normalized frequency-domain excitation in said frequency bin to produce in said frequency bin the modified frequency-domain excitation.

31. A method for modifying a synthesis of a time-domain excitation according to claim 26, comprising, for the frequency bands above a given frequency:
  finding a maximum value per frequency band of the normalized frequency-domain excitation;
  attenuating the matching gain by an amplification factor per frequency bin of the frequency band when the normalized frequency-domain excitation in the frequency bin is lower than a value proportional to the maximum value of the frequency band; and
  applying the attenuated matching gain to the normalized frequency-domain excitation in said frequency bin to produce in said frequency bin the modified frequency-domain excitation.

32. A method for decoding a sound signal encoded by encoding parameters, comprising:
  decoding a time-domain CELP excitation in response to the sound signal encoding parameters;
  synthesizing the decoded time-domain CELP excitation to produce a synthesis of said time-domain CELP excitation; and
  a method according to claim 17, for modifying the synthesis of the time-domain CELP excitation.

* * * * *